(12) United States Patent
Yasui

(10) Patent No.: US 7,196,389 B2
(45) Date of Patent: Mar. 27, 2007

(54) OPTICAL SEMICONDUCTOR DEVICE PACKAGE AND OPTICAL SEMICONDUCTOR DEVICE

(75) Inventor: Nobuyuki Yasui, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 19 days.

(21) Appl. No.: 11/260,403

(22) Filed: Oct. 28, 2005

(65) Prior Publication Data

US 2006/0180823 A1 Aug. 17, 2006

(30) Foreign Application Priority Data

Feb. 14, 2005 (JP) ............................. 2005-036077

(51) Int. Cl.
*H01L 31/0232* (2006.01)
(52) U.S. Cl. ........................................ 257/433; 257/99
(58) Field of Classification Search ................ 257/432, 257/433, 99, 100
See application file for complete search history.

(56) References Cited

U.S. PATENT DOCUMENTS 6,587,491 B1 * 7/2003 Yamamoto ............... 372/43.01

2005/0047460 A1 * 3/2005 Go et al. ...................... 372/43
2005/0047732 A1 * 3/2005 Kato et al. ................... 385/92
2005/0100293 A1 * 5/2005 Warashina et al. ........... 385/92
2005/0111503 A1 * 5/2005 Ishigami et al. ........... 372/38.1

FOREIGN PATENT DOCUMENTS

JP         2004-311923        11/2004

* cited by examiner

*Primary Examiner*—S. V. Clark
(74) *Attorney, Agent, or Firm*—Leydig, Voit & Mayer, Ltd.

(57) ABSTRACT

An optical semiconductor device package includes a disc-shaped stem, metallic leads in rod form penetrating the stem in the direction of the thickness to protrude from a main surface of the stem, and a mount extending vertically from the main surface of the stem, with a plane part of the mount facing the leads. A dielectric substrate is mounted on the plane part, and an optical semiconductor chip is mounted thereon. Two impedance-adjusting dielectric substrates which are rectangular in plan view are provided extending in parallel with the leads, to cover the plane part facing the leads.

11 Claims, 9 Drawing Sheets

F I G . 6
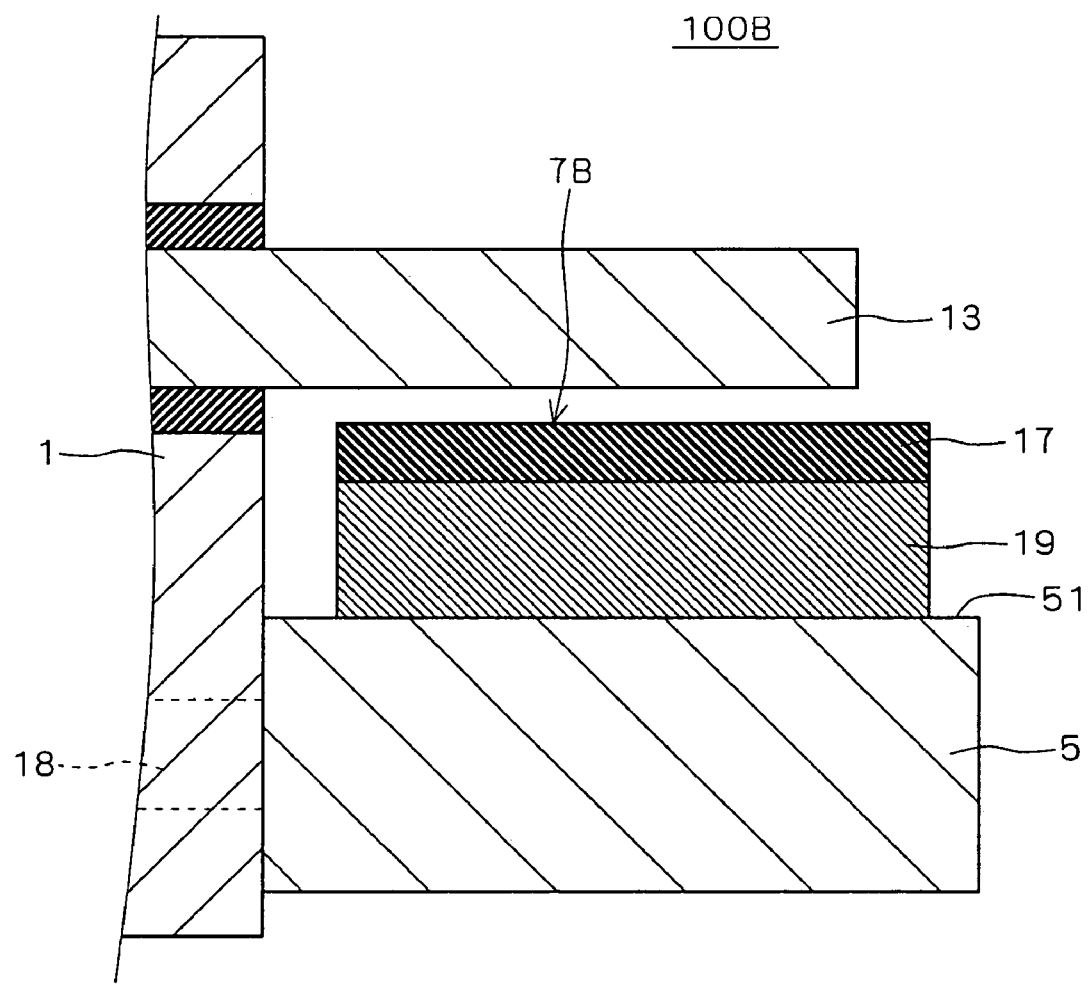

F I G . 1 1
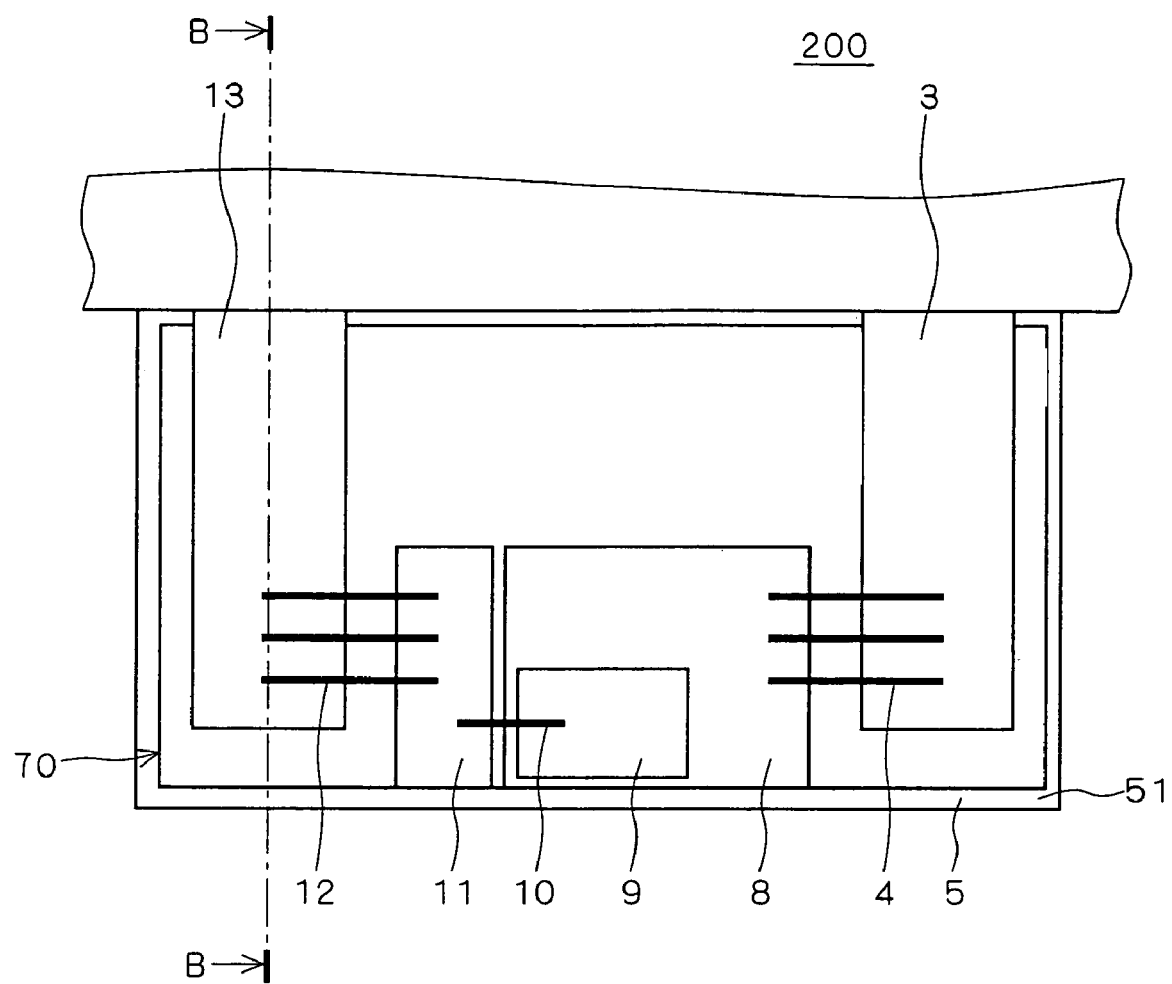

OPTICAL SEMICONDUCTOR DEVICE PACKAGE AND OPTICAL SEMICONDUCTOR DEVICE

BACKGROUND OF THE INVENTION

1. Field of the Invention

This invention relates to optical semiconductor device packages and optical semiconductor devices housing optical semiconductor chips, and in particular to optical semiconductor device packages and optical semiconductor devices in which characteristic impedances of leads are reduced.

2. Description of the Background Art

Recent years have seen an increase in transmission rate in optical communications, up to 10 Gbps or faster in some cases. With this, there have been demands for optical semiconductor chips as well as optical semiconductor device packages housing them that are relatively inexpensive and have excellent high frequency characteristics.

As a structure that satisfies such demands, Japanese Patent Application Laid-Open No. 2004-311923 (FIG. 4) discloses a stem type optical semiconductor device package in coaxial form having a simple structure.

The stem type refers to a structure that includes a disc-shaped substrate called a stem, a plurality of leads penetrating the stem in the direction of the thickness to protrude from a main surface of the stem, and a base at ground potential called a mount that extends vertically from the main surface of the stem, with an optical semiconductor chip being mounted on the mount.

In the stem type optical semiconductor device package, an optical semiconductor chip is mounted not directly on the mount, but on a substrate called a sub-mount that is provided in direct contact with the mount. The optical semiconductor chip and leads are electrically connected by wire.

The stem-penetrating parts of the leads are covered with glass, but the protruding parts from the stem main surface are not covered for the purpose of wire connection. This causes an increase in characteristic impedance of the uncovered parts of the leads, and the resultant characteristic impedance mismatching causes an increase in reflection, thus deteriorating the reflection characteristics. This leads to a reduction in transmission rate.

Therefore, the above Japanese Patent Application Laid-Open No. 2004-311923 discloses, in FIG. 4 for example, a structure in which the characteristic impedances of leads are reduced by providing a dielectric plate on a mount surface facing the leads.

As has been discussed, in the conventional stem type optical semiconductor device package, the characteristic impedances of leads have been reduced by interposing a dielectric plate between the leads and mount. The characteristic impedances in this case are defined by the distance between the leads and mount, which depends on manufacturing accuracy, and the permittivity of the dielectric plate, which depends on the material of the dielectric plate. Therefore, only a low degree of flexibility and a limited range are given in controlling the characteristic impedances.

SUMMARY OF THE INVENTION

It is an object of this invention to provide an optical semiconductor device package and an optical semiconductor device in which characteristic impedance of a lead can be reduced, and a control range of the characteristic impedance of a lead can be widened.

In an aspect of the invention, an optical semiconductor device package housing an optical semiconductor chip includes: a flat-shaped stem; first and second leads in rod form supplying drive current to the optical semiconductor chip, the first and second leads penetrating the stem in a thickness direction to protrude from a main surface of the stem in parallel with each other with a space therebetween; a mounting base mounting the optical semiconductor chip, the mounting base extending vertically from the main surface of the stem and having a plane part facing the first and second leads; and an impedance-adjusting dielectric substrate including at least one conductive layer and at least one dielectric layer laminated therein, the impedance-adjusting dielectric substrate being provided with a space from the first and second leads to cover at least portions facing the first and second leads on the plane part of the mounting base. The mounting base is fixable to ground potential.

By providing the impedance-adjusting dielectric substrate including at least one conductive layer and one dielectric layer laminated therein to cover at least portions facing the first and second leads on the plane part of the mounting base, the distance between the first and second leads and the mounting base is practically narrowed, or a structure equivalent to that is obtained, thereby reducing the characteristic impedances of the protruding parts from the stem main surface of the first and second leads. In addition, the characteristic impedance can be varied by changing the structure of the impedance-adjusting dielectric substrate. This allows greater flexibility and a wider range of control to the characteristic impedance.

These and other objects, features, aspects and advantages of this invention will become more apparent from the following detailed description of this invention when taken in conjunction with the accompanying drawings.

BRIEF DESCRIPTION OF THE DRAWINGS

FIG. 6 is a cross-sectional view of the structure of an optical semiconductor device package according to a second modification to the first preferred embodiment;

FIG. 11 is a plan view of the structure of the optical semiconductor device package according to the second preferred embodiment.

DESCRIPTION OF THE PREFERRED EMBODIMENTS

<A. First Preferred Embodiment>

An optical semiconductor device package according to a first preferred embodiment of this invention will be described with reference to FIGS. 1 to 4.

<A-1. General Device Structure>

Figure 1:
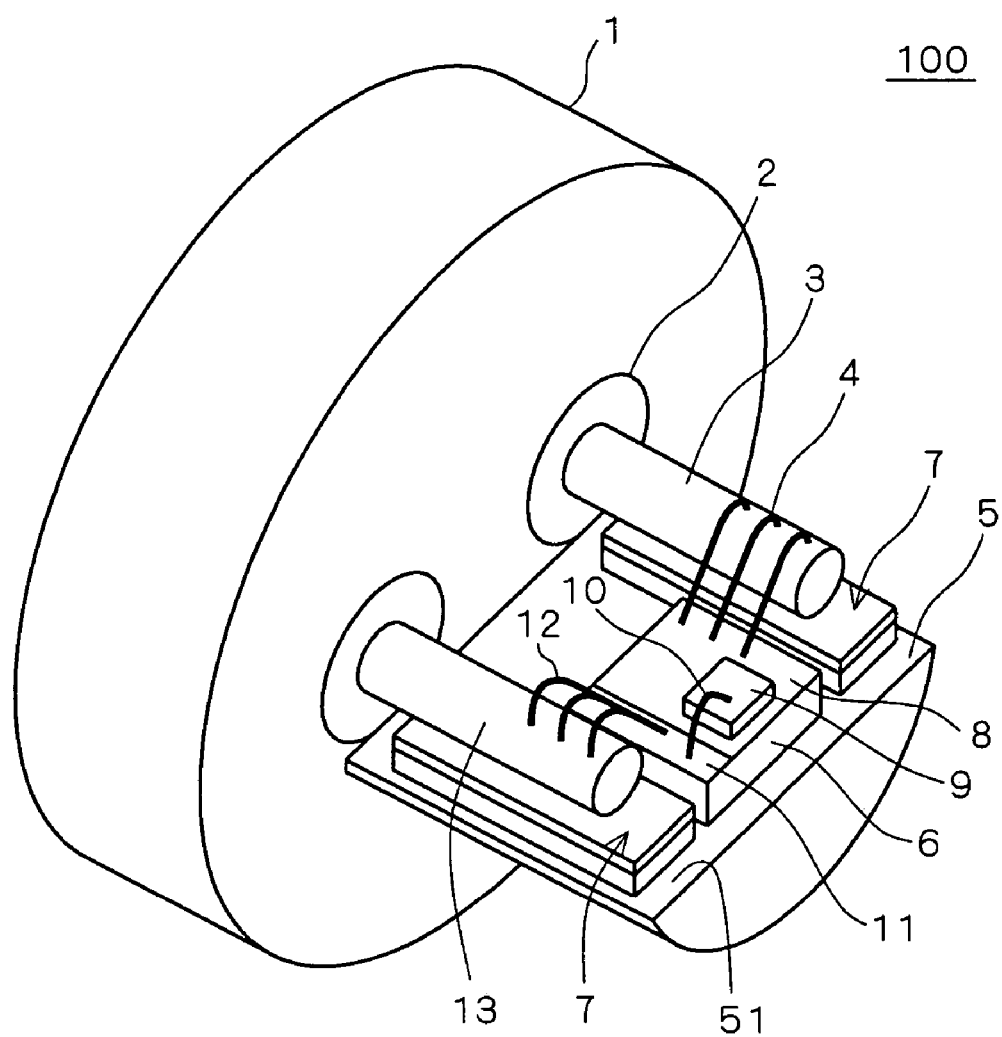
FIG. 1 is a perspective view of the structure of an optical semiconductor device package according to a first preferred embodiment of this invention.

FIG. 1 is a perspective view of the general structure of an optical semiconductor device package 100 according to the first preferred embodiment.

The optical semiconductor device package 100 is the so-called stem type optical semiconductor device package that includes a disc-shaped stem 1, metallic leads 3 and 13 (first and second leads) in rod form penetrating the stem 1 in the direction of the thickness to protrude from a main surface of the stem 1 and a mount 5 having a plane part 51 extending vertically from the main surface of the stem 1.

The mount 5 is a mounting base for an optical semiconductor chip 9, is made of a metal having good electrical conductivity and thermal conductivity, is in half-cylindrical form, for example, and has the plane part 51 facing the leads 3 and 13. A dielectric substrate 6 as a sub-mount is mounted on the plane part 51, and the optical semiconductor chip 9 is mounted thereon.

The leads 3 and 13 protrude from the main surface of the stem 1 in parallel with each other with a space therebetween, and the dielectric substrate 6 is positioned between the leads 3 and 13. In addition, the leads 3 and 13 are electrically connected to conductive patterns 8 and 11 provided on a main surface of the dielectric substrate 6 by a plurality of wires 4 and 12, respectively. The dielectric substrate 6 is made of a dielectric material such as alumina, and has the electrically isolated conductive patterns 8 and 11 formed thereon.

The optical semiconductor chip 9 is a laser device, for example, is mounted on the conductive pattern 8, and has one main electrode (not shown) electrically connected to the conductive pattern 11 by a wire 10. The other main electrode of the optical semiconductor chip 9 is provided in a position facing the conductive pattern 8, and electrically connected to the conductive pattern 8 by being fixed thereon by means of soldering and the like.

The stem 1 is made of a metal having good electrical conductivity and thermal conductivity. The leads 3 and 13 within the stem 1 are covered with a dielectric material 2 such as glass. The leads 3 and 13 also protrude from the opposite surface (rear surface) of the stem 1 to the side on which the mount 5 is provided.

The leads 3 and 13 supply drive current to the optical semiconductor chip 9, and are provided with a predetermined distance from the plane part 51 of the mount 5 so as not to make contact with the mount 5 connected to ground potential. Further, two impedance-adjusting dielectric substrates 7 which are rectangular in plan view are provided extending in parallel with the leads 3 and 13, to cover the plane part 51 facing the leads 3 and 13. The structure of the impedance-adjusting dielectric substrates 7 will be described later.

Figure 2:
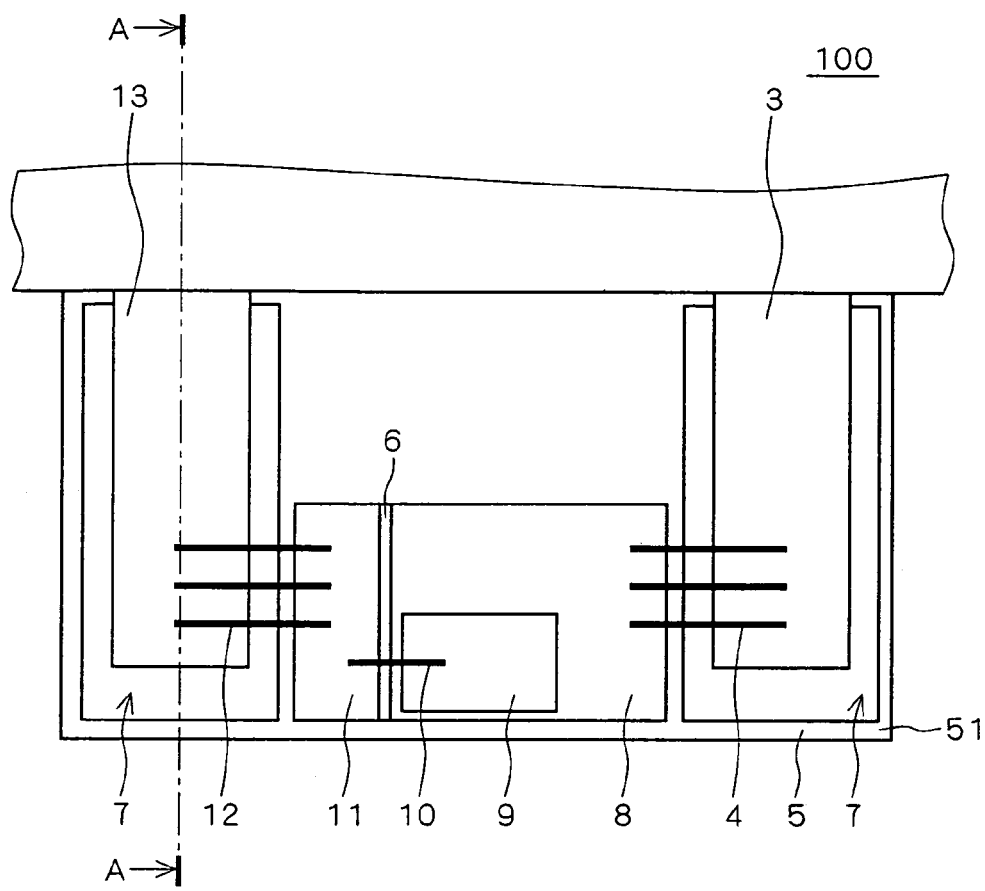
FIG. 2 is a plan view of the structure of the optical semiconductor device package according to the first preferred embodiment.

FIG. 2 is a plan view of the optical semiconductor device package 100 when viewed from above the optical semiconductor chip 9.

As illustrated, it is preferable that the size in plan view of the impedance-adjusting dielectric substrates 7 be larger than the leads 3 and 13 to completely contain the leads 3 and 13 thereon. Namely, it is preferable that the impedance-adjusting dielectric substrates 7 be originally provided in contact with the stem 1. However, the impedance-adjusting dielectric substrates 7 are in reality provided with a predetermined space from the stem 1 as illustrated in FIG. 2. Keeping the impedance-adjusting dielectric substrates 7 away from the stem 1 prevents the occurrence of stress on the stem 1, and further prevents shorts between the stem 1 and the impedance-adjusting dielectric substrates 7 when providing the impedance-adjusting dielectric substrates 7 on the mount 5 by means of soldering and the like. This space is preferably 0.1 mm or more, with a permissible level being 0.15 mm or less. The space is set to 0.12 mm in FIG. 2. It is assumed, with a space to this extent, that the impedance-adjusting dielectric substrates 7 substantially cover at least the portion facing the lead 3 or lead 13.

Figure 3:
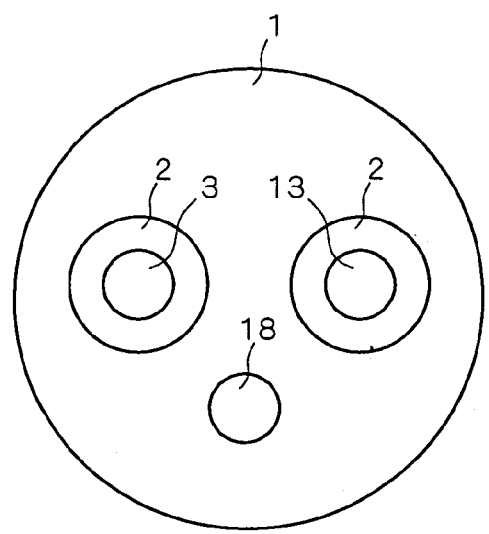
FIG. 3 is a plan view of the optical semiconductor device package according to this invention when viewed from a rear surface of a stem.

FIG. 3 is a plan view of the optical semiconductor device package 100 when viewed from the opposite surface (rear surface) of the stem 1 to the side on which the mount 5 is provided. The leads 3 and 13 as well as a ground lead 18 protrude from this surface. The ground lead 18 penetrates the stem 1 in the direction of the thickness to be connected to the mount 5, thereby fixing the mount 5 and the stem 1 as well to ground potential.

<A-2. Structure and Effect of Impedance-Adjusting Dielectric Substrate>

The structure and effect of the impedance-adjusting dielectric substrates 7 will now be described with reference to FIG. 1 and FIG. 4 that is a sectional view taken along the line A—A in FIG. 2.

Figure 4:
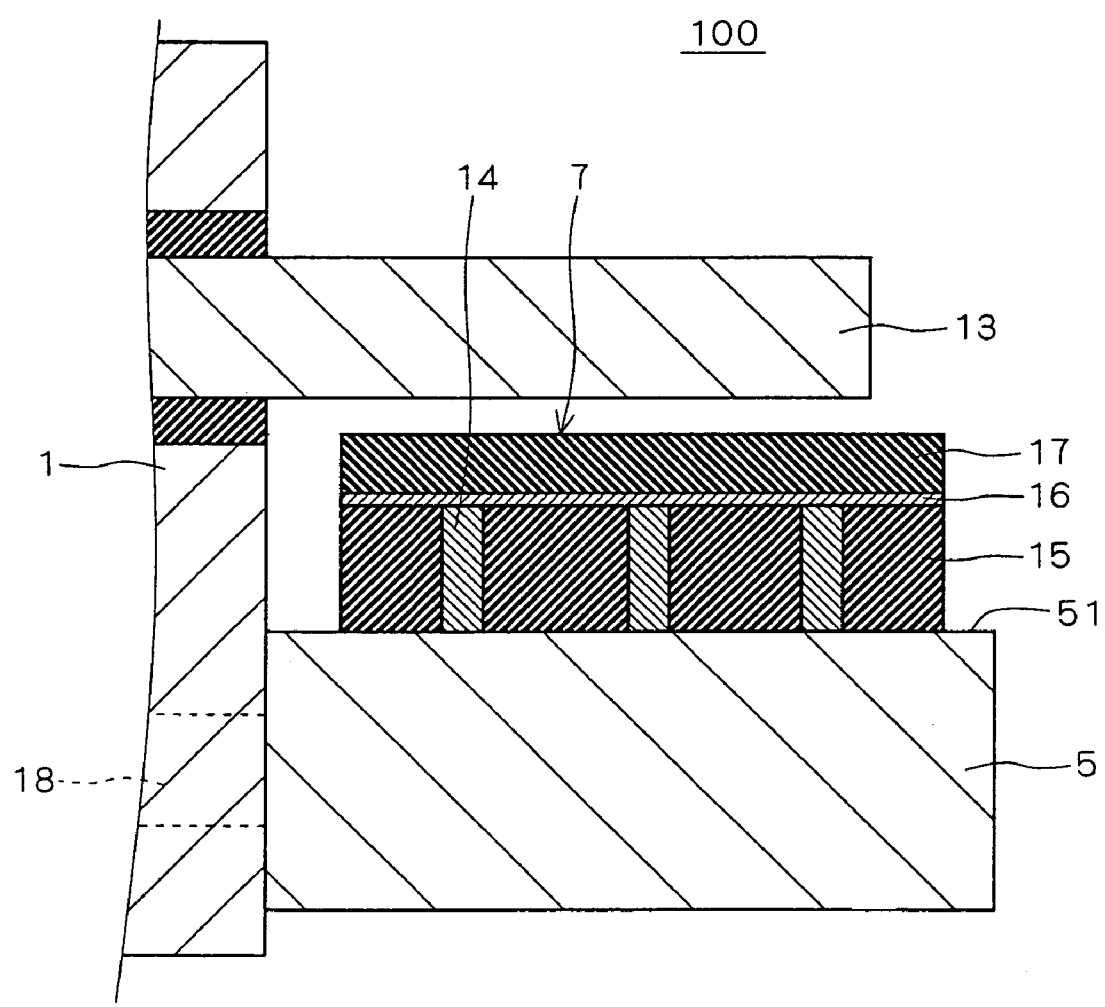
FIG. 4 is a cross-sectional view of the structure of the optical semiconductor device package according to the first preferred embodiment.

As illustrated in FIG. 4, the impedance-adjusting dielectric substrate 7 includes a dielectric layer 15 (first dielectric layer) in contact with the plane part 51 of the mount 5, a conductive layer 16 provided on the dielectric layer 15, a dielectric layer 17 (second dielectric layer) provided on the conductive layer 16, and a plurality of via contacts 14 penetrating the dielectric layer 15 in the direction of the thickness to electrically connect the conductive layer 16 and the mount 5.

The thickness of the impedance-adjusting dielectric substrate 7 is set so that the upper surface thereof, namely, a surface of the dielectric layer 17 facing the leads 3 and 13, does not come into contact with the leads 3 and 13.

The dielectric layer 15 is made of alumina (relative permittivity ∈r=9.4). Before sintering the dielectric layer 15 which will turn ceramic, through holes are made at portions in which the via contacts 14 are to be formed in the dielectric layer 15 and are filled with a metallic material, so that the via contacts 14 can be formed simultaneously by a thermal process in the course of sintering the alumina. The conductive layer 16 is obtained by forming a metallic film such as gold on the surface of the dielectric layer 15 by vacuum evaporation technique.

The dielectric layer 17 is made of alumina (relative permittivity ∈r=9.4), and joined to the dielectric layer 15 having the conductive layer 16 formed thereon by means of brazing using a joining filler material (wax), or by using a conductive adhesive. The impedance-adjusting dielectric substrate 7 is thus formed.

Now, it is assumed that a high frequency signal (current) is transmitted at the transmission rate of 10 Gbps or faster. The signal is first input to the lead 13 and then transmitted to the lead 3 via the optical semiconductor chip 9. With a high frequency signal of 10 GHz, the characteristic impedances of respective parts are as represented below.

First, the part of the lead 13 that is covered with the dielectric material 2 has the same structure as a coaxial cable, whose characteristic impedance $Z_0$ (unit: Ω) is expressed by the following equation (1):

$$Z_o = \frac{138}{\sqrt{\varepsilon r}} \log 10 \frac{b}{a} (\Omega) \quad (1)$$

In the above equation (1), "a" denotes the outside diameter of an inner conductor of the coaxial cable, "b" denotes the inside diameter of an outer conductor, and "∈r" denotes relative permittivity between the inner and outer conductors.

Meanwhile, the part of the lead 13 that protrudes from the main surface of the stem 1 which is not covered with the dielectric material 2, has high characteristic impedance compared to the covered part. The same thing occurs in the lead 3. A wide range of variation in characteristic impedance depending on the location causes impedance mismatching to occur, increasing reflection of a high frequency signal at the boundary between parts having different characteristic impedances. This leads to a reduction in transmission efficiency.

Therefore, the impedance-adjusting dielectric substrates 7 are provided between the leads 3 and 13 and the mount 5 in order to reduce the characteristic impedances of the protruding parts of the leads 3 and 13.

Namely, the characteristic impedance of a signal line of a high frequency signal varies with a various kinds of elements, including space between a ground potential part and the signal line. And the characteristic impedance has a tendency to decrease with a reduction in the space.

In the impedance-adjusting dielectric substrate 7, the conductive layer 16 is electrically connected to the mount 5 by the plurality of via contacts 14 to be at ground potential. Accordingly, the mount 5 practically gets closer to the leads 3 and 13 to practically narrow the distance from the leads 3 and 13, allowing a reduction in characteristic impedance of the protruding parts of the leads 3 and 13.

Given below is an example of a calculated result of the characteristic impedances of the protruding parts of the leads 3 and 13 when the impedance-adjusting dielectric substrates 7 are provided, with a high frequency signal of 10 GHz.

The calculation is based on the assumptions that the leads 3 and 13 are 0.35 mm in diameter, the dielectric material 2 is glass (relative permittivity ∈r=5.6) and 0.7 mm in outer diameter, and the shortest distance from the centers of the leads 3 and 13 to the plane part 51 of the mount 5 is 0.4 mm. These numbers apply to the following descriptions unless otherwise specified. And with the further assumptions that the dielectric layer 15 in the impedance-adjusting dielectric substrate 7 is 0.139 mm in thickness, the dielectric layer 17 is 0.060 mm in thickness, the conductive layer 16 is 0.001 mm in thickness, and the via contacts 14 are 0.3 mm in diameter and 0.139 mm in height, the characteristic impedances of the protruding parts of the leads 3 and 13 are approximately 47 Ω. This value was not obtained by using equations, but was analytically obtained by means of computer simulation.

Meanwhile, the characteristic impedances of the parts of the leads 3 and 13 that are covered with the dielectric material 2, namely, the stem-penetrating parts, are approximately 17 Ω from the above equation (1).

To provide a comparison, the characteristic impedances of the protruding parts of the leads 3 and 13 when the impedance-adjusting dielectric substrates 7 are replaced by dielectric plates (relative permittivity ∈r=9.4) in the same thickness as the substrates 7 are, with a high frequency signal of 10 GHz, approximately 61 Ω. It is therefore understood that the characteristic impedances can be reduced by using the impedance-adjusting dielectric substrates 7.

The above-mentioned characteristic impedance value of the leads 3 and 13 with the use of the impedance-adjusting dielectric substrates 7 is based on the above-mentioned numerical values of the respective layers, and can be varied by changing the thicknesses and materials of the respective layers, and with varying combinations of them.

In addition, the characteristic impedance of the leads 3 and 13 can be varied by changing the structure itself of the impedance-adjusting dielectric substrates 7, and can be further reduced depending on the structure.

That is, when the output impedance of a driver circuit driving the optical semiconductor chip 9 varies due to a type change of the driver circuit, for example, the characteristic impedances of the leads 3 and 13 can be varied simply by replacing the impedance-adjusting dielectric substrates 7. Impedance matching can be easily achieved by bringing the characteristic impedances close to the output impedance of the driver circuit. Therefore, there is no need to redesign the stem 1 with a type change of the driver circuit, which is cost-effective.

Moreover, since the impedance-adjusting dielectric substrates 7 are provided only in the regions facing the leads 3 and 13 on the plane part 51 of the mount 5, there is no need to change the steps (the number of steps) during assembly basically by maintaining the outer dimensions of replacing impedance-adjusting dielectric substrates, which is cost-effective. The manufacturing accuracy can be thus easily maintained. For this reason, it is desirable that the outer dimensions of impedance-adjusting dielectric substrates be positively unified.

Hereafter various kinds of modifications to the impedance-adjusting dielectric substrate 7 will be described.

<A-3. First Modification to Impedance-Adjusting Dielectric Substrate>

In the optical semiconductor device package 100 in FIG. 4 that has been described, the characteristic impedances of the protruding parts of the leads 3 and 13 are reduced by using the impedance-adjusting dielectric substrate 7 that has a three-layer structure including the dielectric layer 15, the conductive layer 16 and the dielectric layer 17. Alternatively, the dielectric layer 17 may be omitted from the surface of the conductive layer 16.

The characteristic impedances of the protruding parts of the leads 3 and 13 can be reduced with the resultant structure as well.

Figure 5:
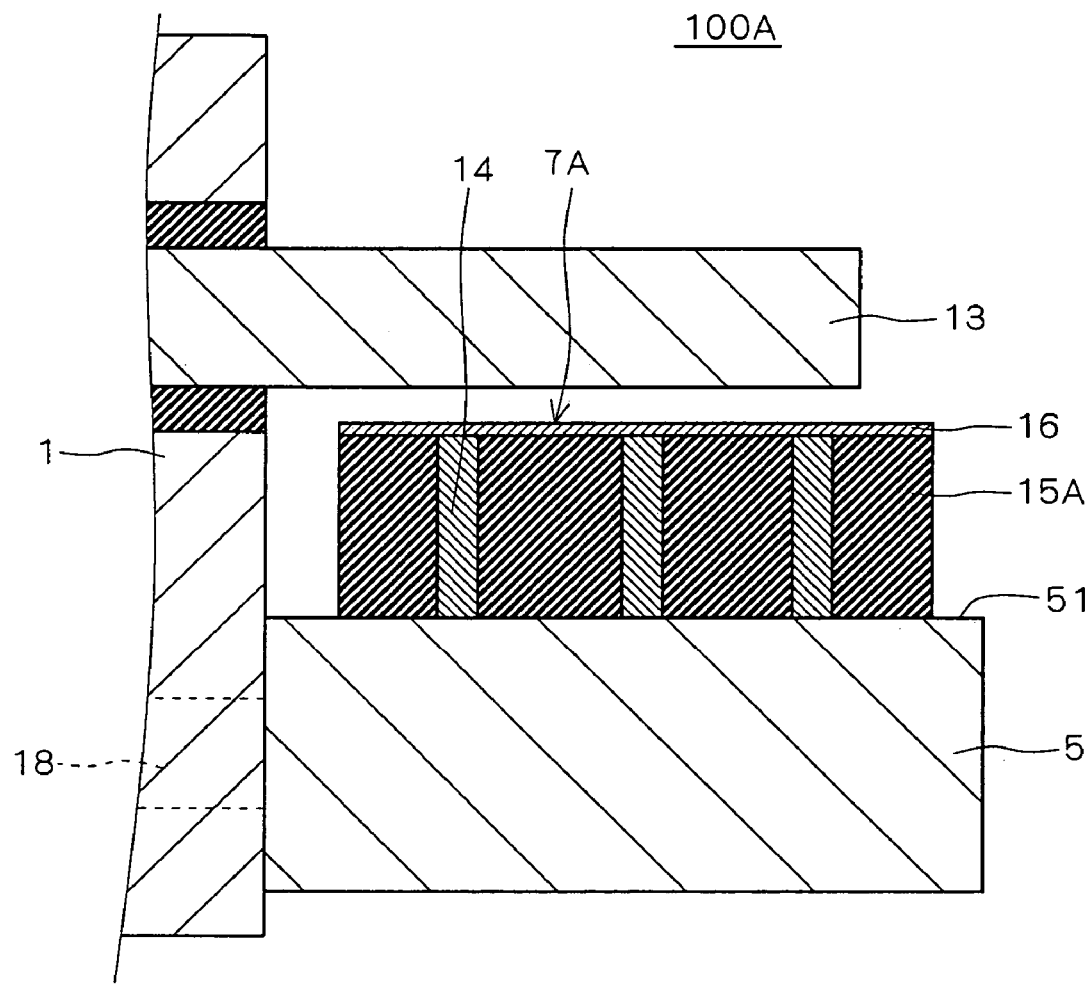
FIG. 5 is a cross-sectional view of the structure of an optical semiconductor device package according to a first modification to the first preferred embodiment.

In an optical semiconductor device package 100A illustrated in FIG. 5, the characteristic impedances of the protruding parts of the leads 3 and 13 are reduced by using an impedance-adjusting dielectric substrate 7A.

Namely, the impedance-adjusting dielectric substrate 7A includes a dielectric layer 15A (relative permittivity ∈r=9.4) in contact with the plane part 51 of the mount 5, the conductive layer 16 provided on the dielectric layer 15A, and the plurality of via contacts 14 penetrating the dielectric layer 15A in the direction of the thickness to electrically connect the conductive layer 16 and the mount 5. The identical features to those in the impedance-adjusting dielectric substrate 7 in FIG. 4 are referred to by the same reference numerals to omit redundant descriptions.

The dielectric layer 15A is 0.199 mm in thickness, which is thicker than the dielectric layer 15 by the thickness of the dielectric layer 17. Thus, the whole thickness of the impedance-adjusting dielectric substrate 7A is the same as the impedance-adjusting dielectric substrate 7. The conductive layer 16 is 0.001 mm in thickness.

The characteristic impedances of the protruding parts of the leads 3 and 13 in this case are, with a high frequency signal of 10 GHz, approximately 36 Ω. This value was obtained by means of computer simulation.

The whole thickness of the impedance-adjusting dielectric substrate 7A that includes the conductive layer 16 as the top layer is set so as not to make contact with the leads 3 and 13. The ability of the dielectric layer 15A to reduce the characteristic impedance decreases with a reduction in thickness thereof. Therefore, when reducing the characteristic impedances of the protruding parts of the leads 3 and 13 as far as possible, the whole thickness is set by making the dielectric layer 15A as thick as possible, and at the same time by avoiding contact with the leads 3 and 13.

<A-4. Second Modification to Impedance-Adjusting Dielectric Substrate>

In the impedance-adjusting dielectric substrates 7 and 7A according to the first preferred embodiment and its first modification, the conductive layer 16 and the mount 5 are electrically connected by the plurality of via contacts 14. Alternatively, a more simplified structure may be used such as is illustrated in FIG. 6.

An optical semiconductor device package 100B in FIG. 6 includes an impedance-adjusting dielectric substrate 7B provided on the plane part 51 of the mount 5 facing the leads 3 and 13. The impedance-adjusting dielectric substrate 7B includes a conductive layer 19 in contact with the plane part 51, and the dielectric layer 17 provided on the conductive layer 19. The identical features to those in the impedance-adjusting dielectric substrate 7 in FIG. 4 are referred to by the same reference numerals to omit redundant descriptions.

The conductive layer 19 is made of metal, for example, and 0.140 mm in thickness. The dielectric layer 17 is 0.060 mm in thickness. The characteristic impedances of the protruding parts of the leads 3 and 13 in this case are, with a high frequency signal of 10 GHz, approximately 47 Ω. This value was obtained by means of computer simulation.

As has been described, the impedance-adjusting dielectric substrate 7B can reduce the characteristic impedances of the protruding parts of the leads 3 and 13 just as effectively as the impedance-adjusting dielectric substrates 7 and 7A, despite its simple structure that only includes the conductive layer 19 and the dielectric layer 17.

The conductive layer 16 and the mount 5 are electrically connected in the impedance-adjusting dielectric substrates 7 and 7A according to the first preferred embodiment and its first modification, while the conductive layer 19 is provided directly on the mount 5 in the impedance-adjusting dielectric substrate 7B according to the second modification. By doing so, the mount 5 practically gets closer to the leads 3 and 13, allowing a reduction in characteristic impedance of the protruding parts.

<A-5. Third Modification to Impedance-Adjusting Dielectric Substrate>

Figure 7:
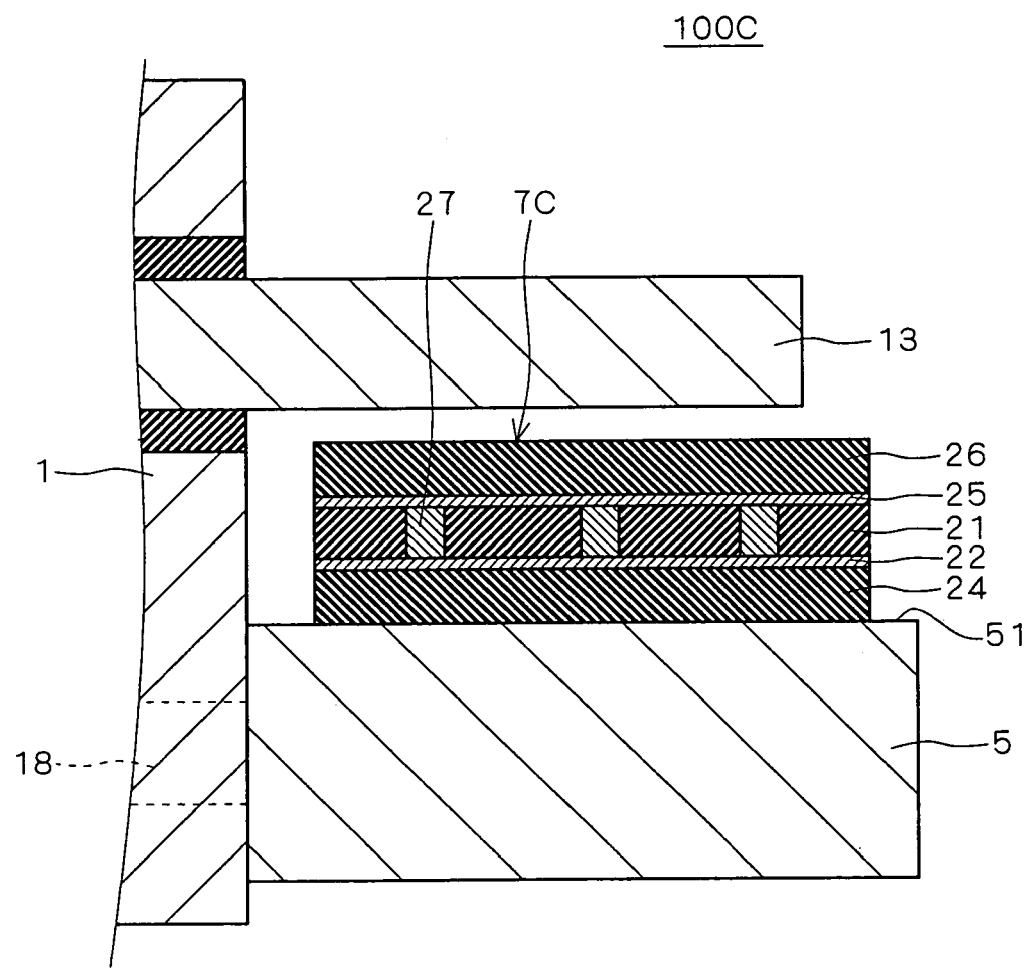
FIG. 7 is a cross-sectional view of the structure of an optical semiconductor device package according to a third modification to the first preferred embodiment.

An optical semiconductor device package 100C illustrated in FIG. 7 includes an impedance-adjusting dielectric substrate 7C provided on the plane part 51 of the mount 5 facing the leads 3 and 13. The impedance-adjusting dielectric substrate 7C includes a dielectric layer 24 (first dielectric layer) in contact with the plane part 51, a conductive layer 22 (first conductive layer) provided on the dielectric layer 24, a dielectric layer 21 (second dielectric layer) provided on the conductive layer 22, a conductive layer 25 (second conductive layer) provided on the dielectric layer 21, a dielectric layer 26 (third dielectric layer) provided on the conductive layer 25, and a plurality of via contacts 27 penetrating the dielectric layer 21 in the direction of the thickness to electrically connect the conductive layers 25 and 22.

The thickness of the impedance-adjusting dielectric substrate 7C is set so that the upper surface thereof, namely, a surface of the dielectric layer 26 facing the leads 3 and 13, does not come into contact with the leads 3 and 13.

The dielectric layers 21, 24 and 26 are all made of alumina (relative permittivity ∈r=9.4). Before sintering the dielectric layer 21 which will turn ceramic, through holes are made at portions in which the via contacts 27 are to be formed in the dielectric layer 21 and are filled with a metallic material, so that the via contacts 27 can be formed simultaneously by a thermal process in the course of sintering the alumina.

The impedance-adjusting dielectric substrate 7C having this structure serves as two capacitors connected in series provided between the lead 3 and the mount 5, and the lead 13 and the mount 5.

Figure 8:
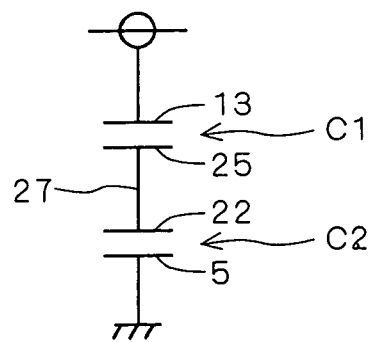
FIG. 8 illustrates an equivalent circuit of capacitors connected in series between a lead and a mount.

FIG. 8 illustrates an equivalent circuit when the impedance-adjusting dielectric substrate 7C is provided. As illustrated, a capacitor C1 is formed between the lead 13 (same as the lead 3) and the conductive layer 25, and a capacitor C2 is formed between the conductive layer 22 and the mount 5. The capacitors C1 and C2 are connected in series by the via contacts 27.

In this structure, the characteristic impedances can be reduced by setting the capacitors C1 and C2 to have large capacities, thus practically narrowing the distance between the leads 13 (same as the lead 3) and the mount 5.

Namely, charge capacity C (unit: F) of a parallel plate capacitor is expressed by the following equation (2):

$$C = \varepsilon_o \varepsilon r \frac{S}{d} (F) \tag{2}$$

In the above equation (2), "S" denotes the area of electrodes, "d" denotes the distance between electrodes, "∈$_o$" denotes vacuum permittivity, and "∈r" denotes relative permittivity between electrodes.

As indicated in the equation (2), the charge capacity C of the capacitor increases by reducing the distance d between electrodes, namely, the thickness of a dielectric, thereby reducing the characteristic impedances.

When using the impedance-adjusting dielectric substrate 7C in which the capacitors C1 and C2 are connected in series, the total charge capacity is reduced by half what it is when using one of the capacitors C1 and C2. Accordingly, the thicknesses of the dielectric layers 24 and 26 are set so that a capacity increase due to thickness reductions of the dielectric layers 24 and 26 is larger than a capacity decrease due to the serial connection.

More specifically, the dielectric layers 24 and 26 are 0.070 mm in thickness, the dielectric layer 21 is 0.058 mm in thickness, the conductive layers 22 and 25 are 0.001 mm in thickness, the via contacts 27 are 0.3 mm in diameter and 0.058 mm in height, the dielectric layers 21, 24 and 26 are made of alumina (relative permittivity ∈r=9.4), and the via contacts 27 and the conductive layers 22 and 25 are made of metal. The characteristic impedances of the protruding parts of the leads 3 and 13 in this case are, with a high frequency signal of 10 GHz, approximately 46 Ω. This value was not obtained by using equations, but was analytically obtained by means of computer simulation.

The characteristic impedances of the protruding parts of the leads 3 and 13 can be reduced further by reducing the thicknesses of the dielectric 24 and 26 further, thus increasing the charge capacity further.

For example, when the dielectric 24 and 26 are 0.018 mm in thickness, the dielectric layer 21 is 0.162 mm in thickness, and the conductive layers 22 and 25 are 0.001 mm in thickness, the characteristic impedances of the protruding parts of the leads 3 and 13 are, with a high frequency signal of 10 GHz, approximately 39 Ω.

In this manner, the characteristic impedances of the protruding parts of the leads 3 and 13 can be varied by changing the thicknesses of the dielectric layers 24 and 26. Impedance matching can therefore be easily achieved by bringing the characteristic impedances close to the output impedance of a driver circuit driving the optical semiconductor chip 9.

A variation range of the characteristic impedance value according to this invention depends on such factors as the range of thickness settings for the conductive layers and dielectric layers that form the impedance-adjusting dielectric substrate, and a combination of adoptable dielectric materials, namely, factors based on a manufacturing technique.

In addition, the impedance-adjusting dielectric substrate 7C, which does not include a conductor in direct contact with the mount 5, can be fixed on the mount 5 by using a non-conductive adhesive. This allows a wider selection of and greater flexibility to how the impedance-adjusting dielectric substrate 7C is mounted.

<A-6. Fourth Modification to Impedance-Adjusting Dielectric Substrate>

Figure 9:
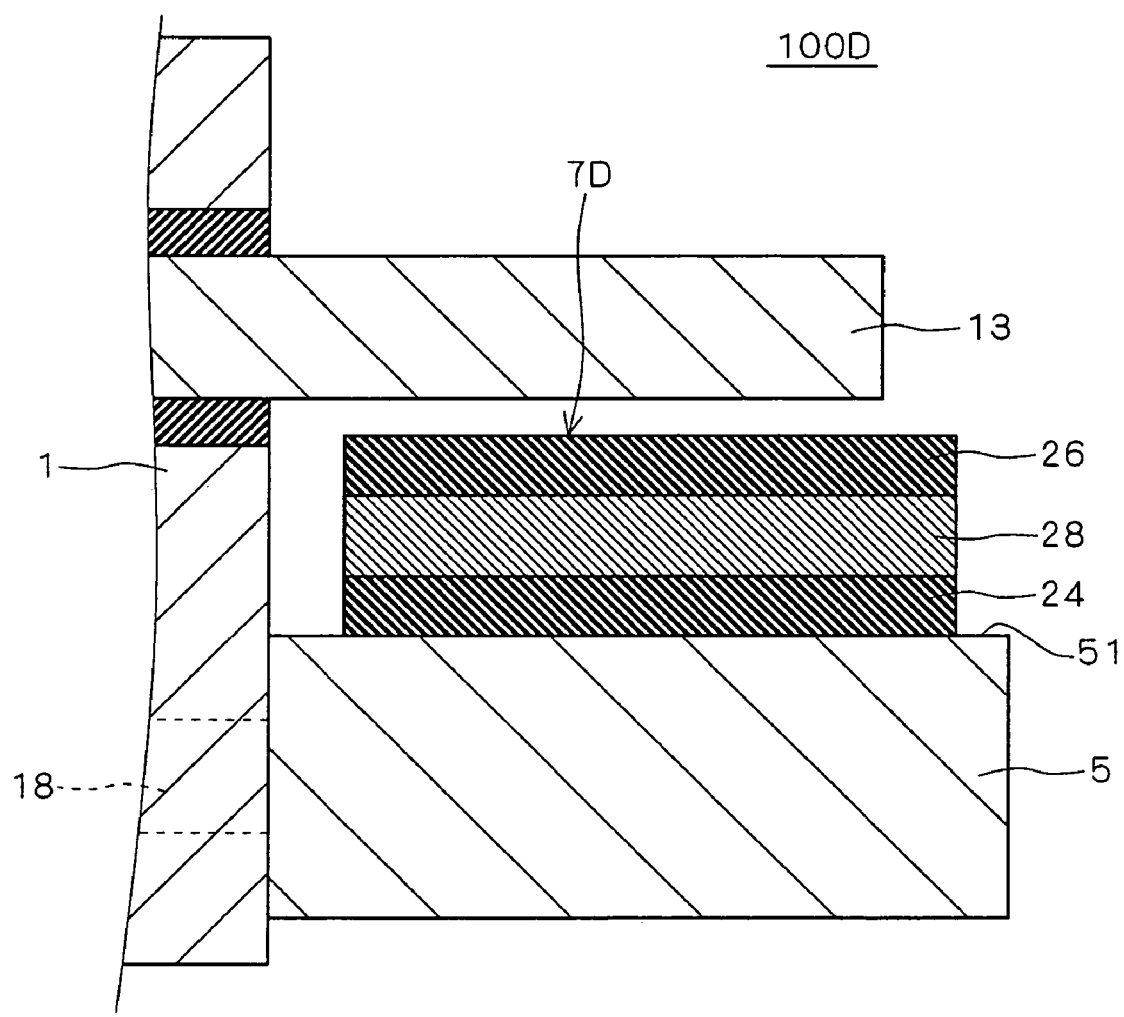
FIG. 9 is a cross-sectional view of the structure of an optical semiconductor device package according to a fourth modification to the first preferred embodiment.

A structure such as is illustrated in FIG. 9 is just as effective as the impedance-adjusting dielectric substrate 7C.

An optical semiconductor device package 100D in FIG. 9 includes an impedance-adjusting dielectric substrate 7D provided on the plane part 51 of the mount 5 facing the leads 3 and 13. The impedance-adjusting dielectric substrate 7D includes the dielectric layer 24 (first dielectric layer) in contact with the plane part 51, a conductive layer 28 provided on the dielectric layer 24, and the dielectric layer 26 (second dielectric layer) provided on the conductive layer 28.

The identical features to those in the impedance-adjusting dielectric substrate 7C in FIG. 7 are referred to by the same reference numerals to omit redundant descriptions.

In the impedance-adjusting dielectric substrate 7D, a capacitor corresponding to the capacitor C1 (FIG. 8) is formed between the lead 13 (same as the lead 3) and the conductive layer 28, and a capacitor corresponding to the capacitor C2 (FIG. 8) is formed between the conductive layer 28 and the mount 5.

In this structure, the characteristic impedances can be reduced by setting the capacitors corresponding to the capacitors C1 and C2 to have large capacities, thus practically narrowing the distance between the leads 13 (same as the lead 3) and the mount 5.

When using the impedance-adjusting dielectric substrate 7D in which the two capacitors are connected in series, the total charge capacity is reduced by half what it is when using one of the two capacitors. Accordingly, the thicknesses of the dielectric 24 and 26 are set so that a capacity increase due to thickness reductions of the dielectric 24 and 26 is larger than a capacity decrease due to the serial connection.

More specifically, the dielectric 24 and 26 are 0.070 mm in thickness, and the conductive layer 28 is 0.060 mm in thickness and made of metal. The characteristic impedances of the protruding parts of the leads 3 and 13 in this case are, with a high frequency signal of 10 GHz, approximately 46 Ω. This value was not obtained by using equations, but was analytically obtained by means of computer simulation.

The characteristic impedances of the protruding parts of the leads 3 and 13 can be reduced further by reducing the thicknesses of the dielectric 24 and 26 further, thus increasing the charge capacity further.

For example, when the dielectric 24 and 26 are 0.018 mm in thickness, and the conductive layer 28 is 0.164 mm in thickness, the characteristic impedances of the protruding parts of the leads 3 and 13 are, with a high frequency signal of 10 GHz, approximately 39 Ω.

As has been described, the impedance-adjusting dielectric substrate 7D can reduce the characteristic impedances as in the case of the impedance-adjusting dielectric substrate 7C with a more simplified structure, which is cost-effective.

<B. Second Preferred Embodiment>

In the optical semiconductor device package 100 according to the first preferred embodiment, the impedance-adjusting dielectric substrates 7 which are rectangular in plan view are provided extending in parallel with the leads 3 and 13 on the plane part 51 of the mount 5 facing the leads 3 and 13, and the impedance-adjusting dielectric substrates 7A to 7D according to the first to fourth modifications also extend in parallel with the leads 3 and 13. However, it will be appreciated that the impedance-adjusting dielectric substrate could have various other shapes in plan view than those examples.

<B-1. General Device Structure>

Figure 10:
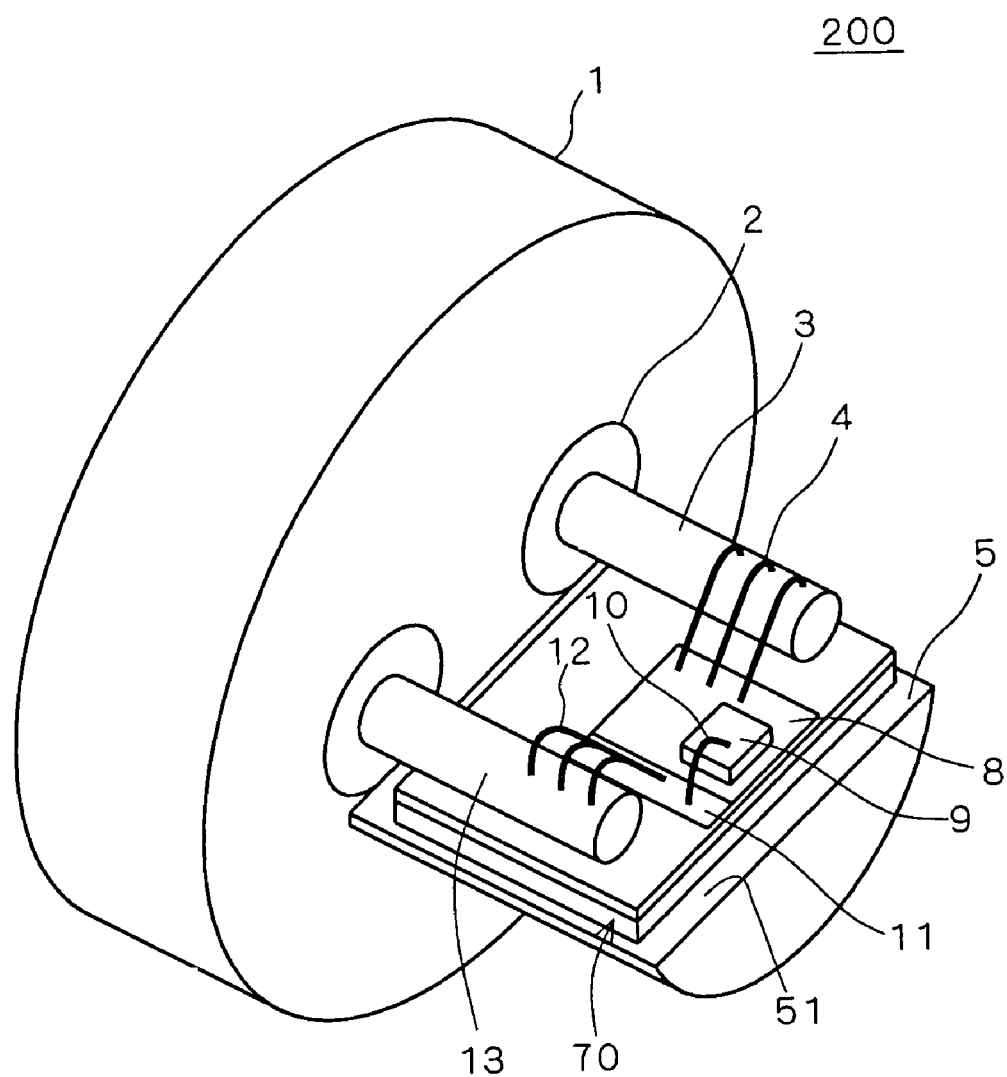
FIG. 10 is a perspective view of the structure of an optical semiconductor device package according to a second preferred embodiment of this invention.

Hereafter the structure of an optical semiconductor device package 200 according to a second preferred embodiment of this invention will be described with reference to FIGS. 10 and 11. The identical features to those in the optical semiconductor device package 100 in FIG. 1 are referred to by the same reference numerals to omit redundant descriptions.

In the optical semiconductor device package 200, an impedance-adjusting dielectric substrate 70 that combines the functions of the dielectric substrate 6 and impedance-adjusting dielectric substrate 7 according to the first preferred embodiment is mounted to cover almost the entire plane part 51 of the mount 5, and the optical semiconductor chip 9 is mounted thereon.

In addition, the leads 3 and 13 are electrically connected to the conductive patterns 8 and 11 provided on a main surface of the impedance-adjusting dielectric substrate 70 by the plurality of wires 4 and 12, respectively.

FIG. 11 is a plan view of the optical semiconductor device package 200 when viewed from above the optical semiconductor chip 9.

As illustrated, the shape in plan view of the impedance-adjusting dielectric substrate 70 is the same as that of the plane part 51 of the mount 5, and the size in plan view of the impedance-adjusting dielectric substrate 70 covers regions on the plane part 51 of the mount 5, the regions including at least two regions facing the leads 3 and 13, and a region sandwiched between the two regions on which the optical semiconductor chip 9 is provided. The leads 3 and 13 are thus completely contained on the impedance-adjusting dielectric substrate 70.

<B-2. Structure and Effect of Impedance-Adjusting Dielectric Substrate>

A cross section of the impedance-adjusting dielectric substrate 70 taken along the line B—B in FIG. 11 can be the same as that of any of the impedance-adjusting dielectric substrate 7 in FIG. 4, and the impedance-adjusting dielectric substrate 7A to 7D in FIGS. 5 to 7 and 9.

Namely, when employing the impedance-adjusting dielectric substrate 7 or 7B that includes the dielectric layer 17 as the top layer, the simple formation of the electrically isolated conductive patterns 8 and 11 on the dielectric layer 17 is all that is needed. Likewise, when employing the impedance-adjusting dielectric substrate 7C or 7D that includes the dielectric layer 26 as the top layer, the conductive patterns 8 and 11 are to be formed on the dielectric layer 26.

In addition, when employing the impedance-adjusting dielectric substrate 7A, the conductive patterns 8 and 11 should be formed along with the conductive layer 16 on the dielectric layer 15, by electrically isolating the conductive patterns 8 and 11 from the conductive layer 16.

The impedance-adjusting dielectric substrate 70 can vary the characteristic impedances of the protruding parts of the leads 3 and 13 as in the case of the first preferred embodiment and its first to fourth modifications. The use of one of the cross sections of the impedance-adjusting dielectric substrates 7 and 7A to 7D attains the respective specific effects.

The impedance-adjusting dielectric substrate 70 has a further advantage over the impedance-adjusting dielectric substrates 7 and 7A to 7D in that the number of components can be reduced.

Namely, although the impedance-adjusting dielectric substrates 7 and 7A to 7D need to be prepared in twos when used, further with the dielectric substrate 6 for mounting the optical semiconductor chip 9 on the mount 5, only a single impedance-adjusting dielectric substrate 70 is enough. This allows a reduction in the number of components and easy assembly of the optical semiconductor element package 200.

In the first and second preferred embodiments described above, optical semiconductor device packages mainly having an optical semiconductor chip mounted thereon are described. An optical semiconductor device package further includes a cap for protecting and sealing the optical semiconductor chip, and is completed as an optical semiconductor device by fixing the cap and stem. The cap naturally includes an optically transparent window (including lens) made of glass or the like and other features, which will not be described in detail because they are known to one of ordinary skill in the art.

Further, although being illustrated as a laser device in the above description, it will be appreciated that the optical semiconductor chip 9 is applicable to a structure including a photodiode, or a structure including a laser device and a photodiode.

This invention is effective for a structure in which a transmission path (lead) and a ground part face each other, and the transmission path is not covered with a dielectric.

Furthermore, although the thickness of the impedance-adjusting dielectric substrate is set so as not to make contact with the lead in the above preferred embodiments, in a structure in which the top layer is not a conductive layer (impedance-adjusting dielectric substrates 7 and 7B to 7D), the thickness of the impedance-adjusting dielectric substrate can be set to the same as the space between the lead and mount, to make contact with the lead.

While the invention has been shown and described in detail, the foregoing description is in all aspects illustrative and not restrictive. It is therefore understood that numerous modifications and variations can be devised without departing from the scope of the invention.

What is claimed is:

1. An optical semiconductor device package housing an optical semiconductor chip, comprising:
   a flat-shaped stem;
   first and second leads in rod form supplying drive current to said optical semiconductor chip, said first and second leads penetrating said stem in a thickness direction to protrude from a main surface of said stem in parallel with each other with a space therebetween;
   a mounting base mounting said optical semiconductor chip, said mounting base extending vertically from said main surface of said stem and having a plane part facing said first and second leads; and
   an impedance-adjusting dielectric substrate including at least one conductive layer and at least one dielectric layer laminated therein, said impedance-adjusting dielectric substrate being provided with a space from said first and second leads to cover at least portions facing said first and second leads on said plane part of said mounting base,
   said mounting base being fixable to ground potential.

2. The optical semiconductor device package according to claim 1, wherein said conductive layer in said impedance-adjusting dielectric substrate is electrically connected to said mounting base.

3. The optical semiconductor device package according to claim 2, wherein said dielectric layer in said impedance-adjusting dielectric substrate includes:
   a first dielectric layer provided below said conductive layer; and
   a second dielectric layer provided above said conductive layer,
   said conductive layer being electrically connected to said mounting base by a via contact penetrating said first dielectric layer in a thickness direction.

4. The optical semiconductor device package according to claim 2, wherein said dielectric layer in said impedance-adjusting dielectric substrate is provided below said conductive layer,
   said conductive layer being electrically connected to said mounting base by a via contact penetrating said dielectric layer in a thickness direction.

5. The optical semiconductor device package according to claim 2, wherein
   said dielectric layer in said impedance-adjusting dielectric substrate is provided above said conductive layer, and
   said conductive layer is provided in contact with said plane part of said mounting base.

6. The optical semiconductor device package according to claim 1, wherein said impedance-adjusting dielectric substrate includes a structure in which two capacitors are connected in series as said dielectric layer as a dielectric material, said structure being provided between said first lead and said mounting base, and between said second lead and said mounting base.

7. The optical semiconductor device package according to claim 6, wherein
   said dielectric layer in said impedance-adjusting dielectric substrate includes first to third dielectric layers, and
   said conductive layer includes first and second conductive layers,
   said first dielectric layer being provided in contact with said plane part of said mounting base,
   said first conductive layer, said second dielectric layer, said second conductive layer, and said third dielectric layer being laminated in order on said first dielectric layer, and said first and second conductive layers being electrically connected to each other by a via contact penetrating said second dielectric layer in a thickness direction.

8. The optical semiconductor device package according to claim 6, wherein said dielectric layer in said impedance-adjusting dielectric substrate includes:
   a first dielectric layer provided below said conductive layer; and
   a second dielectric layer provided above said conductive layer,
   said first dielectric layer being provided in contact with said plane part of said mounting base.

9. The optical semiconductor device package according to claim 1, wherein said impedance-adjusting dielectric substrate is provided to cover two regions facing said first and second leads on said plane part of said mounting base, and a region sandwiched between said two regions on which said optical semiconductor chip is mounted,
   said optical semiconductor chip being provided on said impedance-adjusting dielectric substrate.

10. An optical semiconductor device comprising:
    the optical semiconductor device package recited in claim 1; and
    a cap sealing said optical semiconductor chip housed within said optical semiconductor device package.

11. An optical semiconductor device package housing an optical semiconductor chip, comprising:
    a flat-shaped stem;
    first and second leads in rod form supplying drive current to said optical semiconductor chip, said first and second leads penetrating said stem in a thickness direction to protrude from a main surface of said stem in parallel with each other with a space therebetween;
    a mounting base mounting said optical semiconductor chip, said mounting base extending vertically from said main surface of said stem and having a plane part facing said first and second leads; and
    at least one impedance-adjusting dielectric substrate including at least one conductive layer and at least one dielectric layer laminated therein, said at least one impedance-adjusting dielectric substrate being provided with a space from said first and second leads to cover at least portions facing said first and second leads on said plane part of said mounting base,
    said mounting base being fixable to ground potential, and
    said at least one impedance-adjusting dielectric substrate each being provided extending in parallel with said first and second leads in regions facing said first and second leads on said plane part of said mounting base.

* * * * *